United States Patent [19]

Rydval

[11] 4,400,802

[45] Aug. 23, 1983

[54] INTEGRATED DIGITAL SEMICONDUCTOR CIRCUIT

[75] Inventor: Peter Rydval, Munich, Fed. Rep. of Germany

[73] Assignee: Siemens Aktiengesellschaft, Berlin and Munich, Fed. Rep. of Germany

[21] Appl. No.: 231,005

[22] Filed: Feb. 3, 1981

[30] Foreign Application Priority Data

Feb. 7, 1980 [DE] Fed. Rep. of Germany ....... 3004565

[51] Int. Cl.³ .......................... G11C 7/00; G11C 7/02
[52] U.S. Cl. .................................... 365/226; 365/190; 365/206
[58] Field of Search ............... 365/154, 155, 206, 226, 365/190

[56] References Cited

U.S. PATENT DOCUMENTS

| | | | |
|---|---|---|---|
| 4,168,490 | 9/1979 | Stinehelfer | 365/226 |
| 4,198,698 | 4/1980 | Ong et al. | 365/226 |
| 4,295,210 | 10/1981 | Beranger et al. | 365/226 |

FOREIGN PATENT DOCUMENTS 2430784 2/1977 Fed. Rep. of Germany .

Primary Examiner—Stuart N. Hecker
Attorney, Agent, or Firm—Herbert L. Lerner; Laurence A. Greenberg

[57] ABSTRACT

Integrated digital semiconductor circuit, including a plurality of inputs, a common constant-current source for selectively supplying the inputs, the inputs being operable in a "1" logic level state and a "0" logic level state, internal switching means for switching the inputs to a first operating state of the common constant-current source in which all of the inputs are at the "0" level and to a second operating state of the common constant-current source in which a given number of the inputs are at the "1" level and the other of the inputs are at the "0" level, a resistor being connected between the common constant-current source and each of the inputs, each of the resistors being identical to each other and being constructed in dependence on the first and second operating states of the common constant-current source.

5 Claims, 3 Drawing Figures

INTEGRATED DIGITAL SEMICONDUCTOR CIRCUIT

The invention relates to an integrated digital semiconductor circuit with several inputs which can be supplied by a common constant-current source, the level of which corresponds either to the state "1" or the state "0", and which are controlled by internal switching processes in such a manner that either all these inputs must have the level "0" or a defined fixed number of these inputs must have the level "1" and the rest, the level "0".

Such semiconductor circuits may be constructed, for instance, as ROM memories, as decoders or as encoders.

The invention relates predominantly to an integrated static write-read memory with a memory matrix of indentical memory cells which are each in the form of a bistable multivibrator and can each be combined and addressed row by row by a word line and column by column by at least one bit line each. The addressing of each of the individual matrix rows is provided therein by one transistor which is connected with a current-carrying electrode to a first supply potential and can be switched by means of its control electrode on one hand, and on the other hand by a circuit section which is assigned to a constant-current source connected to a second supply potential through the respective matrix row and serves for charge reversal. Finally, the individual matrix columns therein are addressed by the bit lines associated with the individual matrix columns.

As an example of the pertinent state of the art, German Pat. No. 24 30 784 should be mentioned here. In that patent a bipolar semiconductor memory corresponding to the just-mentioned measures is described. The charge reversal circuit parts constructed in accordance with the disclosure therein are assembled by means of transistors and resistors. As was recognized according to the invention, however, the transistors of the charge reversal circuits can be saved and the charge reversal circuits can each be replaced by a suitably constructed resistor.

It is accordingly an object of the invention to provide an integrated digital semiconductor circuit which overcomes the hereinafore-mentioned disadvantages of the heretofore-known devices of this general type.

With the foregoing and other objects is view there is provided, in accordance with the invention, an integrated digital semiconductor circuit, comprising a plurality of inputs, a common constant-current source for selectively supplying the inputs, the inputs being operable in a "1" logic level state and a "0" logic level state, internal switching means or processes for switching the inputs to a first operating state of the common constant-current source in which all of the inputs are at the "0" level and to a second operating state of the common constant-current source in which a given number of the inputs are at the "1" level and the other of the inputs are at the "0" level, only a resistor being connected between the common constant-current source and each of the inputs, each of the resistors being identical to each other and being constructed in dependence on the first and second operating states of the common constant-current source.

According to the description given hereinafore, these two operating states are determined, on the one hand, by the fact that the n inputs provided overall for supply by the constant-current source of the digital semiconductor circuit have the level logic "0" in one operating state, while these are switched, on the other hand, in the other operating state, due to the construction of the digital circuit in the manner known per se. In this way, just $n_1$ of these n inputs have the level logic "1" and just $(n-n_1)$ have the level logic "0". It obviously applies here that n be larger than $n_1$. In the integrated static write-read memory defined above, $n_1 = 1$.

In accordance with another feature of the invention, in the first operating state of the constant-current source all of the inputs which are to be addressed by the circuit are kept at the "0" level, and in the second operating state a fixed partial amount of the inputs are lifted to the "1" level and the other of the inputs are kept at the "0" level.

In accordance with a further feature of the invention, in the second operating state always only one of the inputs which are to be addressed by the constant-current source is lifted to the "1" level and the others of the inputs are kept at the "0" level.

In accordance with an added feature of the invention, the circuit is a static bipolar memory with memory cells disposed in the form of a matrix having rows, and there is provided a common supply output for the common constant-current source, a first and a second supply potential source, bipolar transistors each having a collector connected (grounded) to the first supply potential source and an emitter, a common word line being assigned to the memory cells of each matrix row and having a first word line section connected to the emitter of one of the bipolar transistors and a second word line section being connected through one of the resistors to the common supply output of the common constant-current source, the common constant-current source being connected to the second supply potential, and each of the other word lines being connected to the second supply potential through one of the resistors.

In accordance with an additional feature of the invention, the resistors connected between the common constant-current source and the digital circuit are constructed in accordance with the formula:

$$R = \frac{U \cdot (p + k - 1)}{I \cdot (k - 1)}$$

where U is the voltage excursion between the level "0" and the level "1", p is the total number of inputs of the digital circuit to be acted upon in common by the common constant-current source, k is the ratio of the selection current $I_A$ conducted through the individual inputs 1 . . . p at the level "1" to the rest current $I_A$ existing at the level "0", and the total current I is obtained on the basis of the formula:

$$I = I_R(n-1) + I_A$$

where n is the total number of rows of the memory matrix.

In accordance with again another feature of the invention, there are provided two bit lines containing matrix columns of the memory cells, the individual memory cells being constructed of two npn bipolar transistors forming a bistable multivibrator, each of the transistors having a collector and two emitters, one of the emitters being connected to the second line section providing the connection to the constant-current source of the word-line including two partial lines connected through the individual memory cells of the respective matrix row, and the other of the emitters being addressed by one of the two bit lines, and a load resistor connected between each collector and the first line section of a matrix row.

In accordance with a concomitant feature of the invention, the part of the individual word lines facing away from the constant-current source is connected to the emitter of an npn-transistor, which in turn is connected in a (grounded) collector circuit to the first supply potential, the common constant-current source is in the form of an npn transistor having an emitter addressed by the second supply potential and a collector connected through each of the resistors to the second line section of the individual word lines.

Other features which are considered as characteristic for the invention are set forth in the appended claims.

Although the invention is illustrated and described herein as embodied in an integrated digital semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
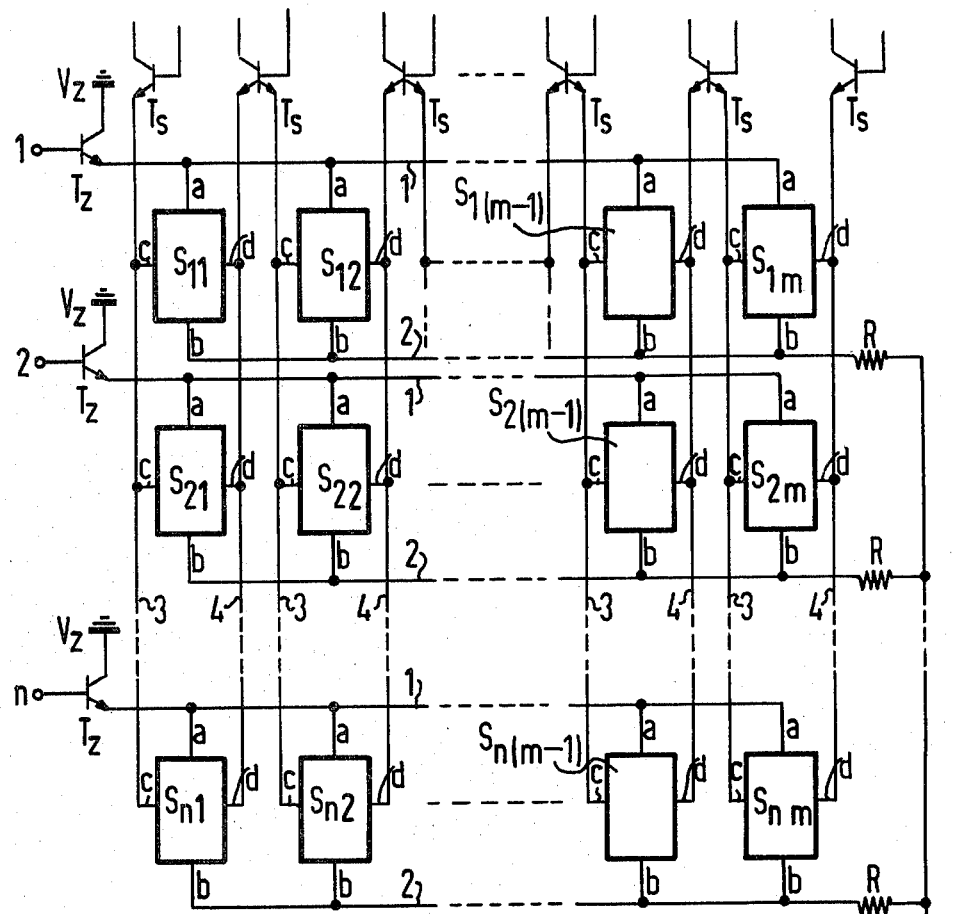
FIG. 1 is a schematic and block diagrammatic view of the matrix connection of individual memory cells to a constant-memory source according to the invention.

Referring now to the figures of the drawing and first particularly to FIGS. 1 and 2 thereof, this specific case will now be discussed first. The generalized system shown in FIG. 3 as a block diagram will be explained at the end of this description.

Figure 2:
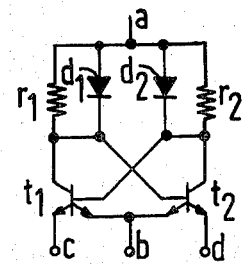
FIG. 2 is a schematic diagram of the individual storage cell.

As just indicated, FIGS. 1 and 2 refer to the application of the invention to a monolithically integrated semiconductor memory of the type mentioned hereinafore, which is constructed in bipolar technology.

With respect to FIG. 2 it should merely be stated that two bipolar transistors $t_1$ and $t_2$ of the npn-type with two emitters each are provided per memory cell (which are designated in FIG. 1 with reference symbols $S_{11}$ to $S_{nm}$). The transistors are connected together in the customary manner to form a bistable multivibrator by connecting the base of each to the collector of the respective other transistor as well as by connecting each of their collectors through a load resistor $r_1$ or $r_2$ to a common first terminal a and by connecting one of the two emitters of each to a common terminal b. This multivibrator is completed by two diodes $d_1$ and $d_2$ connected in the forward direction, which serve as a shunt across the two load resistors $r_1$ and $r_2$ in the manner shown in FIG. 2. The other emitter of the transistor $t_1$ forms the control input c, and the other emitter of the transistor $t_2$ forms a second control input d of the individual memory cell.

The memory matrix which is shown in FIG. 1 and is constructed by means of the memory cells shown in FIG. 2 has n rows and m columns. Accordingly, the first row contains the cells $S_{11}, S_{12}, \ldots S_{1m}$, the second row contains the cells $S_{21}, \ldots S_{2m}$ etc., and the last row contains the cells $S_{n1}$ to $S_{nm}$.

Above and below the cells of the individual rows, a line running parallel to the rows is provided each time, where the line running above the respective row has the reference numeral 1 and the line running below the row has the reference numeral 2. In the similar manner a line 3 and 4, running parallel to the columns is provided on both sides of each of the memory cells forming the individual columns. The line 1 which is assigned to the respective individual matrix rows is connected directly to the terminal a of all memory cells forming the respective matrix row. Similarly, the terminal b of the memory cells forming the individual matrix rows is connected to the conductor 2 which is assigned to the respective row. The terminals c of the memory cells forming the individual matrix columns are connected to the line 3 assigned to the respective column, and the terminals d are connected to the respectively assigned line 4, which runs parallel to the columns.

As can be seen from FIG. 1, each of the lines 1 is connected to the emitter of the transistor $T_z$ which is operated in grounded collector connection, the base of which forms a control input which is assigned to the respective row and is designated with the number of the respective row, and the collector of which is connected to a first electric operating potential $V_z$ which serves as the supply of the matrix and is identical for all rows.

Each of the lines 1 and 2 running parallel to the columns is connected in the manner shown in FIG. 1 to an emitter of transistors $T_s$ which are constructed like the transistors $T_z$, $t_1$ and $t_2$, and are formed as npn-transistors. Since the connection of the individual lines 3 and 4 parallel to the columns to the transistors $T_s$ as well the addressing of the transistors $T_s$ is accomplished in the usual manner, and is of no immediate significance for the invention, these will not be discussed in detail.

According to the invention, each of the lines 2 parallel to the rows is now each connected through a resistor R to the supply output of the common constant-current source KQ. The resistors R are equal and must be chosen in accordance with the following presentations.

First, it should be noted that the pairs of lines 1 and 2 which run parallel to the rows and are assigned to the individual rows represent the word line of the respective row, and the pairs of lines 3 and 4 which run parallel to the columns and are assigned to the individual columns represent the bit lines assigned to the respective row and can be addressed accordingly.

The constant-current source KQ is represented in the example shown in FIG. 1 by an npn-transistor T*, the collector of which is connected through the individual resistors R to the individual lines 2 parallel to the rows, and thereby to the terminals b of all memory cells $S_{11}$ to $S_{nm}$. Meanwhile the base of the transistor T* is connected to an auxiliary potential $U_K$ which is in particular regulated and is derived from the supply potentials of the overall circuit. The emitter of the transistor T* forming the constant-current source is finally connected through a resistor $R_G$ to the second supply potential V of the circuit.

The supply transistors $T_z$ are, as can be seen, devoted at the same time to the row selection and are operated as emitter followers. This is likewise also the case with the transistors corresponding to them in the memories according to German Patent DE-PS No. 24 30 784. Here, the charge capacity of the lines 1 and 2 which run parallel to the rows and serve to supply the individual memory cells, i.e. the word line capacity, plays an appreciable role with respect to the switching speed, so that in the present case, as in the known circuit, measures are taken which serve for the charge reversal. In the present case therefore the resistor R of equal size are provided. Their size depends on the number $n_1$ fixed for the individual circuits as well as on the flow of current through the constant-current source KQ.

In the case of the matrix memory shown in FIG. 1, $n_1 = 1$ because of the type of circuit to be used there. Accordingly, two operating states are to be distinguished here. In the first of these operating states, all word lines and therefore the lines 2 carry the level logic "0", and in the second operating state, any one or more of these lines carries the level "1" and the remaining $(n-1)$ lines carry the level "0". In that case, according to a further feature of the invention, each of the resistors R should approach the value according to the formula $$R = \frac{U \cdot (n + k - 1)}{I \cdot (k - 1)} \quad (1)$$

where U is the word line excursion which is given by the difference of the selection voltage $U_A$ to be applied to the individual word lines 1, 2 and the rest voltage $U_R$. Again, n means the total number of rows of the memory matrix and k is the switching ratio given by the quotient $k = I_A/I_R$, where $I_A$ is the selection current and $I_R$ the rest current conducted through the individual word lines. The total current I is calculated on the basis of the formula.

$$I = I_R \cdot (n-1) + I_A. \quad (2)$$

This represents the current flowing through all the n word lines if, which is the case as a rule, only one of the n word lines is addressed in any one case.

Figure 3:
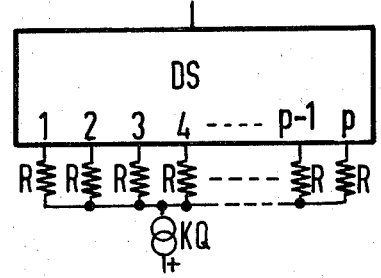
FIG. 3 is a schematic and block diagrammatic view of the generalized system.

Instead of a memory, the digital circuit DS of FIG. 3 to be acted upon by the constant-current source KQ may, for instance, be a "1-of p-decoder", an encoder or another circuit of the type defined hereinafore. If this circuit DS is constructed so that at most only one of the p provided inputs 1, 2, ... (p−1), p which are provided and are to be acted on by the constant-current source, can have the level logic "1" while all remaining inputs must have the level "0" then the same conditions prevail as in the memory shown in FIG. 1. The construction formulas (1) and (2) for the resistors R which in accordance with FIG. 2 must be inserted in series with the individual word line sections 2 can then also be applied logically for the construction of the resistors (see FIG. 3) which are to be connected into the individual inputs 1 to p and of the common constant-current source KQ, since the individual lines 2 of the circuit according to FIG. 1 are to be equated to the inputs 1 to p of the generalization in accordance with FIG. 3.

For the (rare) case in which $n_1$ is larger than 1, formula (2) must be modified accordingly.

There is claimed:

1. Integrated digital semiconductor circuit, comprising n terminals, a common constant current source for supplying said terminals, said current source being in the form of a transistor having a current supplying output, each of said terminals being operable in an identical logic level "1" in one operating state and each of said terminals being operable in an identical logic level "0" in another operating state, the digital semiconductor circuit being operable in one operating state in which all of said terminals are at the logic level "0" and in remaining operating states in which a given partial number of said terminals are at the logic level "1" and the others of said terminals are at the logic level "0", n equal resistors each being connected between said current supplying output and a respective one of said terminals, said resistors forming an exclusive connection between said constant current source and said terminals, said resistors having resistance values R being adjustable according to the formula:

$$R = \frac{U \cdot (n + k - 1)}{I \cdot (k - 1)}$$

where U is the voltage excursion between the logic level "0" and the logic level "1", k is the ratio between the current flowing through one of said terminals at the logic level "1" and the current flowing through the one terminal at the logic level "0", and I is the value of the total current flowing through all of said terminals in said operating states.

2. Semiconductor circuit according to claim 1, wherein in said remaining operating states exactly one terminal impressed through said constant current source always has the logic level "1" and all of the remaining terminals always have the logic level "0".

3. Semiconductor circuit according to claim 1 or 2, wherein the circuit is a static bipolar memory with memory cells disposed in the form of a matrix having rows, and including a common supply output for said common constant-current source, a first and a second supply potential source, bipolar transistors each having a collector connected to said first supply potential source and an emitter, a common word line being assigned to the memory cells of each matrix row and having a first word line section connected to the emitter of one of said bipolar transistors and a second word line section being connected through one of said resistors to said common supply output of said common constant-current source, said common constant-current source being connected to said second supply potential, and each of the other word lines being connected to said second supply potential through one of said resistors.

4. Semiconductor circuit according to claim 1 or 2, wherein said resistors connected between said common constant-current source and said terminals are constructed in accordance with the formula:

$$R = \frac{U \cdot (p + k - 1)}{I \cdot (k - 1)}$$

where U is the voltage excursion between the level "0" and the level "1", p is the total number of terminals of the digital circuit to be acted upon in common by the common constant-current source, k is the ratio of the selection current $I_A$ conducted through the individual inputs 1 ... p at the level "1" to the rest current $I_A$ existing at the level "0", and the total current I is obtained on the basis of the formula:

$$I = I_R(n=1) + I_A$$

where n is the total number of rows of the memory matrix.

5. Semiconductor circuit according to claim 1 or 2, including two bit lines containing matrix columns of the memory cells, the individual memory cells being constructed of two npn bipolar transistors forming a bistable multivibrator, each of said transistors having a collector and two emitters, one of said emitters being connected to said second line section and the other of said emitters being addressed by one of said two bit lines, and a load resistor connected between each collector and said first line section of a matrix row.

* * * * *